(12) United States Patent
Blessing et al.

(10) Patent No.: US 8,166,637 B2
(45) Date of Patent: May 1, 2012

(54) APPARATUS FOR MOUNTING A FLIP CHIP ON A SUBSTRATE

(75) Inventors: Patrick Blessing, Thalwil (CH); Ruedi Grueter, Buttisholz (CH); Dominik Werne, Oberaegeri (CH)

(73) Assignee: ESEC AG, Cham (CH)

( * ) Notice: Subject to any disclaimer, the term of this patent is extended or adjusted under 35 U.S.C. 154(b) by 355 days.

(21) Appl. No.: 12/525,535

(22) PCT Filed: Jan. 25, 2008

(86) PCT No.: PCT/EP2008/050841
§ 371 (c)(1),
(2), (4) Date: Jul. 31, 2009

(87) PCT Pub. No.: WO2008/092798
PCT Pub. Date: Aug. 7, 2008

(65) Prior Publication Data
US 2010/0040449 A1 Feb. 18, 2010

(30) Foreign Application Priority Data
Jan. 31, 2007 (CH) .................................. 0158/07

(51) Int. Cl.
*B23P 19/00* (2006.01)
(52) U.S. Cl. ............... 29/740; 29/720; 29/739; 29/741; 29/833
(58) Field of Classification Search .......... 29/729, 29/739, 740–743, 832–834, 705, 719, 722, 29/33 M; 228/4.1, 8–9; 156/349; 700/254; 382/145–151
See application file for complete search history.

(56) References Cited

U.S. PATENT DOCUMENTS

| 5,195,234 | A | 3/1993 | Pine et al. |
| 6,248,201 | B1 * | 6/2001 | Boyd et al. ................. 156/247 |
| 7,020,953 | B2 * | 4/2006 | Ueno et al. ................... 29/740 |
| 7,020,954 | B2 * | 4/2006 | Hartmann et al. ........... 29/760 |
| 7,044,182 | B2 * | 5/2006 | Haraguchi ................ 156/351 |
| 7,047,632 | B2 | 5/2006 | Arikado |
| 7,597,234 | B2 * | 10/2009 | Blessing et al. ............. 228/105 |
| 2003/0071109 | A1 | 4/2003 | Arikado |
| 2004/0020043 | A1 | 2/2004 | Ueno et al. |
| 2005/0283972 | A1 | 12/2005 | Ueno et al. |

FOREIGN PATENT DOCUMENTS

| DE | 20019096 U1 | 2/2001 |
| DE | 10055631 A1 | 5/2002 |
| EP | 1412139 B1 | 4/2004 |
| WO | 9943192 | 8/1999 |
| WO | 0167831 A2 | 9/2001 |
| WO | 0167838 A2 | 9/2001 |
| WO | 03058708 A1 | 7/2003 |

* cited by examiner

*Primary Examiner* — Minh Trinh
(74) *Attorney, Agent, or Firm* — Nixon Peabody LLP

(57) ABSTRACT

An apparatus for mounting semiconductor chips as flip chips on a substrate includes a chip supply, a pick-and-place system with a bonding head having a chip gripper, a flipping apparatus operable to rotate the chip from a first position to a second (flipped) position through an angle with a gripper and two cameras. The first camera determines a position of the chip before the flipping apparatus receives the chip and also determines a position of the flipped chip received by the chip gripper of the bonding head once the flipping apparatus has transferred the chip to it. The apparatus also comprises an optical switch, e.g., a rotatable mirror located in the field of view of the first camera. The mirror operates to rotate with the gripper of the flipping apparatus but at half the angle.

4 Claims, 3 Drawing Sheets

APPARATUS FOR MOUNTING A FLIP CHIP ON A SUBSTRATE

CROSS REFERENCE TO RELATED APPLICATIONS

The present application is related to and claims priority based upon PCT Patent Application No. PCT/EP2008/050841 entitled "Apparatus for mounting a flip chip on a substrate", filed Jan. 25, 2008, which, in turn, claims priority from Swiss Patent Application No. 158/07, filed on Jan. 31, 2007, the disclosure of both of which is hereby incorporated herein by reference.

TECHNICAL FIELD

The invention relates to an apparatus for mounting a flip chip on a substrate of the type mentioned in the preamble of claim 1. A flip chip is a semiconductor chip which has a surface with so-called bumps through which electric connections with the substrate are made.

BACKGROUND OF THE INVENTION

When mounting semiconductor chips on a substrate, the substrate is usually made available on a horizontally aligned supporting surface and the semiconductor chips are provided on a wafer table, with the electric connecting surfaces of the semiconductor chips facing upwardly. The semiconductor chip is then removed by a bonding head of an automatic mounting machine, which is a so-called die bonder, and placed on the substrate. This mounting method is known in the field as epoxy die bonding or softsolder die bonding, depending on whether the semiconductor chip is glued with epoxy to the substrate or is soldered with solder to the substrate. The flip chip method differs from this mounting method in that the electric as well as the mechanical connection between the semiconductor chip and the substrate is made via the bumps. To ensure that the semiconductor chip with the bumps can be mounted, it needs to be turned (flipped) by 180° after removal from the wafer table, which explains the name flip chip.

In the flip chip method, the bumps of the semiconductor chip need to be brought into contact with the electric connecting surfaces of the substrate, the so-called pads. The demands placed on placement precision are therefore higher in the flip chip method than in epoxy die bonding. An automatic mounting machine for the mounting of flip chips comprises a flipping apparatus which removes the semiconductor chip from the wafer table and flips the same, a pick-and-place device with a bonding head which receives the flipped semiconductor chip from the flipping apparatus and places the same on the substrate, and three cameras, with the first camera taking a picture of the semiconductor chip presented on the wafer table, the second camera taking a picture of the received semiconductor chip that has already been flipped and is therefore a flip chip, i.e., a picture of the surface of the semiconductor chip provided with the bumps, and a third camera taking a picture of the substrate with the pads. The picture of the first camera is used in order to check the position of the semiconductor chip provided by the wafer table and to newly position the wafer table if necessary, so that the flipping apparatus can receive the semiconductor chip and transfer it to the bonding head. The pictures of the second and third camera are used in order to determine the position of the flip chip and the position of the substrate, so that the bonding head can place the flip chip in a positionally precise manner on the substrate.

BRIEF DESCRIPTION OF THE INVENTION

The invention is based on the finding that the tasks of the first and second camera can be assumed by a single camera without giving rise to any technical or process-relevant disadvantages.

The invention relates to an apparatus for mounting semiconductor chips as flip chip on a substrate. The apparatus comprises means for the feeding of semiconductor chips to a predetermined position, e.g., a wafer table or waffle pack, and the like. The apparatus further comprises a pick-and-place system with a bonding head with a chip gripper, a flipping apparatus with a gripper and two cameras. The gripper of the flipping apparatus can be rotated about a predetermined axis and is used in a first rotational position to receive from the wafer the semiconductor chip provided by the aforementioned means, and to transfer the same in a second rotational position as a flip chip to the chip gripper of the bonding head. The first camera is used on the one hand to determine the actual position of the semiconductor chips on the wafer as provided by the aforementioned means for mounting before the flipping apparatus receives the semiconductor chip, and it is used on the other hand to determine the actual position of the flip chip received by the chip gripper of the bonding head after the flipping apparatus has transferred the semiconductor chip. The second camera is used to determine the position of the substrate place. In accordance with the invention, the apparatus comprises an optical switch which is used to alternatingly set a first or a second field of view for the first camera, with the semiconductor chip provided by the mentioned means being situated in the first field of view and the semiconductor chip held by the chip gripper being situated in the second field of view. The flipping apparatus and the optical switch are operatively connected with each other in such a way that in the case of a change of the flipping apparatus from the first rotational position to the second rotational position the field of view of the camera changes from the first field of view to the second field of view. The operative connection between the flipping apparatus and the optical switch is preferably a mechanical operative connection.

The optical switch comprises a mirror for example which is held rotatably about a predetermined axis and which is located in front of the first camera. In operation, the mirror is rotated simultaneously with the gripper of the flipping apparatus, but only by half the angle. This means that when the gripper is rotated about the angle θ, the mirror is rotated about the angle θ/2. The rotation of the mirror preferably occurs by means of two levers which are situated in stretched position relative to each other when the lever has reached the one or other end position.

The apparatus can alternatively comprise a color filter cross which on the one hand images in a first color the semiconductor chip provided by the mentioned means at the predetermined position onto the camera and on the other hand images in another second color the semiconductor chip held by the chip gripper onto the camera. The optical switch consists in this case of two color filters, of which the one is transparent for the one color and the other for the second color. In the case of a change in the rotational position of the flipping apparatus, the one or other color filter is automatically brought into the beam path of the camera, so that the field of view of the camera will change. Instead of the color filters it is also possible to work with polarizers.

DESCRIPTION OF THE FIGURES

The accompanying drawings, which are incorporated into and constitute a part of this specification, illustrate one or more embodiments of the present invention and, together with the detailed description, serve to explain the principles and implementations of the invention. The figures are not to scale. In the drawings.

DETAILED DESCRIPTION OF THE INVENTION

Figure 1:
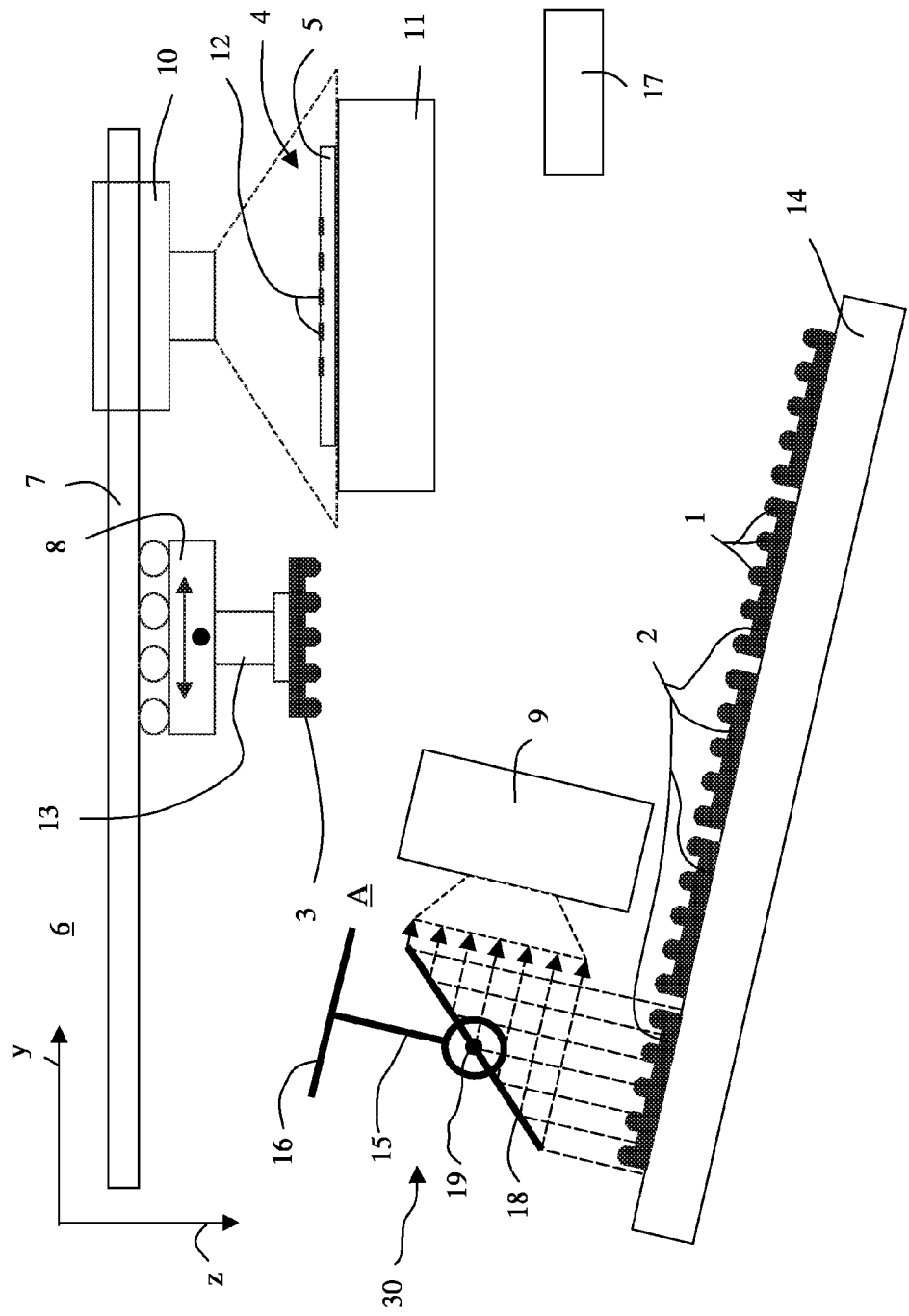
FIG. 1 shows an automatic mounting machine with a flipping apparatus and a mirror, with the flipping apparatus and the mirror being situated in a first end position.

FIG. 1 shows a schematic view of an example of an automatic mounting machine for mounting a semiconductor chip 2, which is a so-called flip chip and comprises bumps 1, onto a substrate place 4 of a substrate 5. In the sectional view as shown in FIG. 1, five bumps 1 are situated next to one another for each semiconductor chip 3. Five pads 12 situated next to one another in a row on the substrate place 4 correspond to said bumps. The coordinates of a Cartesian system of coordinates are designated with x, y and z, with the x-coordinate extending perpendicular to the plane of the drawing. The automatic mounting machine comprises a so-called pick-and-place system 6 with a bonding head 8 which can be reciprocated along an axis 7 extending in the y-direction, and two cameras 9 and 10 which each comprise an associated image processing module. The position of the bonding head 8 on the axis 7 is regulated by means of a known position measuring and control circuit which is not explained here in closer detail. The substrates 5 are conveyed by a conveying system in the x-direction to a bonding station 11 where the bonding head 8 places a flip chip each on a substrate place 4 which comprises electric contact surfaces, so-called pads 12, which are associated with the bumps 1. Bonding head 8 comprises a chip gripper 13 which can be moved in a reciprocating manner upward and downward in the z-direction and is rotatable about its longitudinal axis, which in this case is about the z-axis. The semiconductor chips 2 are provided on a wafer table 14 for example, with the bumps 1 of the semiconductor chips 2 facing upwardly. The semiconductor chips 2 can also be provided with other means such as waffle packs or tapes. The automatic mounting machine further comprises a flipping apparatus 15 with a gripper 16 and a control and computing unit 17 which controls the automatic mounting machine. The flipping apparatus 15 is rotatable back and forth between two end positions A and B. The wafer table 14 is arranged in such a way that the flipping apparatus 15 can be placed between the wafer table 14 and the bonding head 8. The first camera 9 fulfils two functions in accordance with the invention: It determines on the one hand the actual position of the semiconductor chip 2 provided by the wafer table 14 for mounting and on the other hand the actual position of the flip chip 3 taken up by the chip gripper 13 of bonding head 8. In order to ensure that the first camera 9 can fulfill these two functions, an optical switch 30 comprising a mirror 18 is arranged in the flipping apparatus 15 which is also turned when the semiconductor chip 2 is turned. The mirror 18 is arranged in the field of view of the first camera 9.

Figure 2:
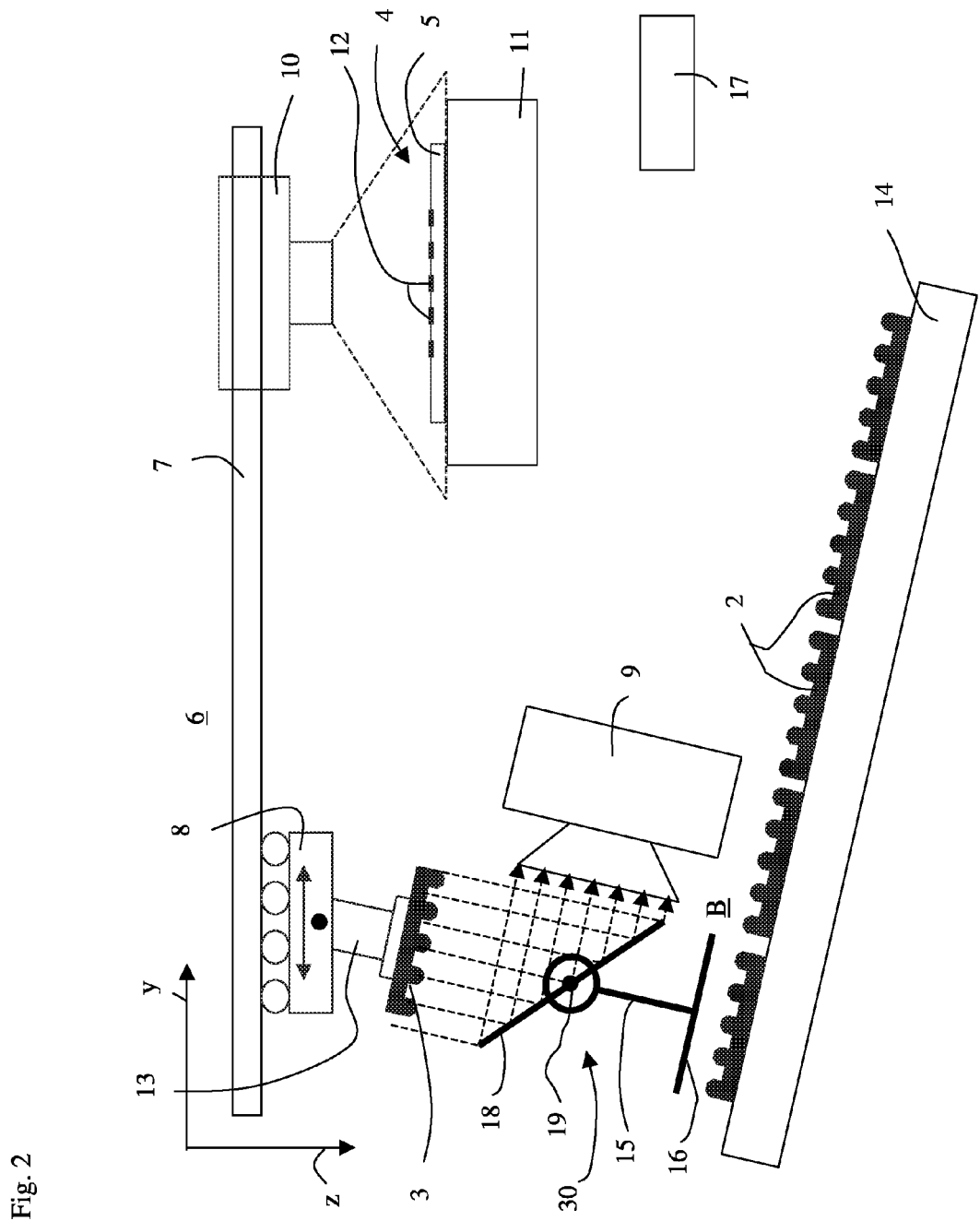
FIG. 2 shows the automatic mounting machine, with the flipping apparatus and the mirror being situated in a second end position.

The flipping apparatus 15 and the mirror 18 change back and forth between the two end positions A and B. In FIG. 1, the flipping apparatus 15 and the mirror 18 are in the end position A in which the gripper 16 faces the pick-and-place system 6, while the mirror 18 faces the wafer table 14. The first camera 9 thus sees the semiconductor chip 2 provided by the wafer table 14. In FIG. 2, the flipping apparatus 15 and the mirror 18 are in the end position B in which the gripper 16 faces the wafer table 14, while the mirror 18 faces the pick-and-place system 6. The first camera 9 thus sees the flip chip 3 held by the chip gripper 13 of the bonding head 8. When changing from the end position A to the end position B, the gripper 16 is rotated about an axis 19 extending in the x-direction about the angle θ (not shown in the figures), while the mirror 18 is simultaneously rotated about half the angle θ/2. In the example the angle is θ=180°. The angle θ depends on the overall construction of the wafer table 14 and the pick-and-place system 6 and can therefore also have a value other than 180°.

The flipping apparatus 15 further comprises lighting means in order to illuminate in the end position A the semiconductor chip 2 provided by the wafer table 14 and in the end position B the flip chip 3 held by the chip gripper 13 of bonding head 8. In the end position A, direct illumination is possible, i.e., an illumination with light which extends parallel to the optical axis and thus impinges perpendicularly on the semiconductor chip 2, whereas in the end position B indirect illumination is advantageous, i.e., illumination with light which impinges in an oblique way on the flip chip 3.

The interaction of flipping apparatus 15, mirror 18 and first camera 9 will now be explained in closer detail. The following state is assumed at first: The flipping apparatus 15 is located in the first end position A, as shown in FIG. 1. The wafer table 14 has made available a semiconductor chip 2 for mounting. The chip gripper 13 of bonding head 8 holds a flip chip 3 whose bumps 1 have been whetted and whose actual position still needs to be determined. The chip gripper 13 is located above the flipping apparatus 15. The apparatus works as follows:

The first camera 9 takes a picture of the semiconductor chip 2 provided by the wafer table 14 and the associated image processing module determines the actual position of the semiconductor chip 2 from the picture and the deviation from the desired position of the semiconductor chip 2. The deviation of the actual position from the desired position is determined by three values Δu, Δv and Δφ, with Δu and Δv designating, as usual, the deviation in two orthogonal directions and Δφ the deviation of the rotational position.

As long as the three values Δu, Δv and Δφ do not exceed predetermined limit values, the flipping apparatus 15 is turned to the second end position B where it will grasp the provided semiconductor chip 2. This state is shown in FIG. 2. The bonding head 8 is moved to a predetermined position. The first camera 9 takes a picture of the flip chip 3 held by the chip gripper 13 of the bonding head 8 and the associated image processing module determines the actual position of the flip chip 3 from the picture. Then the bonding head 8 places the semiconductor chip on the substrate 5 and returns to the predetermined position, so that the chip gripper 13 can receive the next semiconductor chip 2 from the flipping apparatus 15.

The flipping apparatus 15 is turned to the first end position A and transfers the semiconductor chip as a flip chip 3 to the chip gripper 13 of the bonding head 8. The bonding head 8 facultatively moves the flip chip 3 to a wetting station where the bumps 1 of the flip chip 3 are wetted with a fluxing agent, and back again to the position above the flipping apparatus 15. The wafer table 14 then presents the next semiconductor chip 2 for mounting. The initial position has now been reached again and the next cycle begins.

Figure 3:
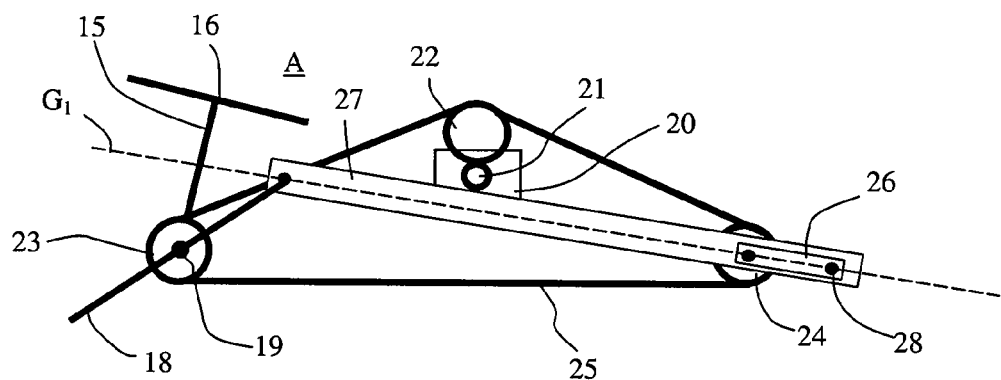
FIGS. 3, 4 show a drive mechanism for the flipping apparatus and the mirror.
Figure 4:
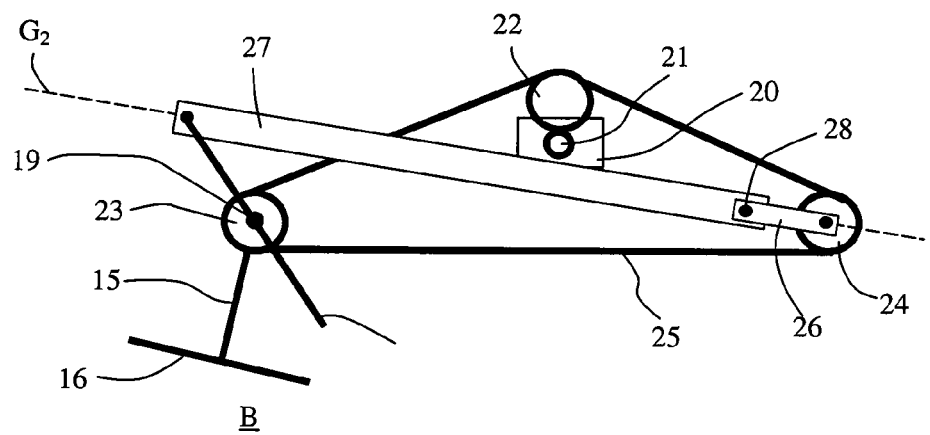

FIGS. 3 and 4 show an advantageous drive mechanism which rotates the gripper 16 of the flipping apparatus about the angle θ, in the present example about the angle θ=180°, and the mirror 18 about half the angle θ/2. FIG. 3 shows the gripper 16 of the flipping apparatus 15 and the mirror 18 in the end position A. FIG. 4 shows the gripper 16 of flipping apparatus 15 and the mirror 18 in the end position B. The drive mechanism comprises a motor 20, a reduction gear consisting of two gearwheels 21 and 22, a third gearwheel 23 and a fourth gearwheel 24, a toothed belt 25 and two levers 26 and 27. The four gearwheels 21 to 24 are rotatable about axes which extend parallel with respect to each other and in the x-direction, which in this case is perpendicular to the drawing plane. The gripper 16 of the flipping apparatus 15 rotates together with the third gearwheel 23. A first end of the first lever 26 rotates with the fourth gearwheel 24, a first end of the second lever 27 is fastened to the mirror 18 and the two other ends of the two levers 26 and 27 are rotatably held on a common bolt 28. The third gearwheel 23 and the fourth gearwheel 24 have the same size. When therefore motor 20 turns the third gearwheel 23 and the gripper 16 via the gearwheels 21 and 22 and the toothed belt 25 about 180°, then the fourth gearwheel 24 is also rotated about 180°. The length $L_1$ of the first lever 26 and the length $L_2$ of the second lever 27 are dimensioned in such a way that the two levers 26 and 27 are each in the stretched position relative to each other when the mirror 18 has reached end position A or end position B. Stretched position means that the two levers 26 and 27 are situated on a common straight line $G_1$ (FIG. 3) or $G_2$ (FIG. 4). The first lever 26 acts as a drive lever, the second lever 27 acts as a transfer lever. This drive mechanism offers the following advantages:

A single motor is sufficient in order to rotate the gripper 16 about the angle θ and the mirror 18 about half the angle θ/2.

The utilization of the stretched position of the two levers 26 and 27 leads to the consequence that the rotational position of mirror 18 is reproducible with a high amount of precision both in the end position A as well as in the end position B.

Mirror 18 will achieve a rotational position that is reproducible with high precision without requiring any stops on which the mirror 18 is mechanically aligned.

An alternative drive mechanism comprises a motor which drives a V-belt pulley having a first diameter. The first V-belt pulley drives a second V-belt pulley which has the same diameter and on which the mirror is arranged, and simultaneously a third V-belt pulley which has a diameter which is half as large and on which the flipping apparatus is arranged. A rotation of the first V-belt pulley about 90° then causes a rotation of the second V-belt pulley about 90° and a rotation of the third V-belt pulley about 180°.

It is also possible to equip the drive mechanism for the rotation of the gripper 16 and the rotation of the mirror 18 with two separate drives which are independent from each other.

The invention claimed is:

1. An apparatus for mounting a semiconductor chip as a flip chip on a substrate, comprising:
   means for supplying the semiconductor chip to a predetermined position;
   a pick-and-place system with a bonding head having a chip gripper;
   a flipping apparatus with a gripper, the flipping apparatus held rotatably about a predetermined axis and configured to be used in a first rotational position to receive the semiconductor chip at the predetermined position which is provided by the means for supplying and in a second rotational position to transfer the semiconductor chip as a flip chip to the chip gripper of the bonding head;
   a camera for taking a picture; and
   an optical switch configured for setting in an alternating manner a first or second field of view for the camera, with the semiconductor chip provided by the means for supplying located in the first field of view and with the semiconductor chip held by the chip gripper of the bonding head being located in the second field of view;
   wherein the flipping apparatus and the optical switch are operatively connected with each other in such a way that in the case of a change of the flipping apparatus from the first rotational position to the second rotational position the field of view of the camera changes from the first field of view to the second field of view.

2. The apparatus according to claim 1, wherein the operative connection between the flipping apparatus and the optical switch is a mechanical operative connection.

3. The apparatus according to claim 1, wherein the optical switch comprises a rotatably held mirror.

4. The apparatus according to claim 2, wherein the optical switch comprises a rotatably held mirror.

* * * * *